(12) United States Patent
Kumari et al.

(10) Patent No.: US 11,106,518 B2
(45) Date of Patent: Aug. 31, 2021

(54) FAILURE MODE STUDY BASED ERROR CORRECTION

(71) Applicant: Western Digital Technologies, Inc., San Jose, CA (US)

(72) Inventors: Indu Kumari, San Jose, CA (US); Narendhiran CR, San Jose, CA (US); Abhinand Amarnath, San Jose, CA (US); Balakumar Rajendran, San Jose, CA (US); Muralitharan Jayaraman, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 98 days.

(21) Appl. No.: 16/289,738

(22) Filed: Mar. 1, 2019

(65) Prior Publication Data
US 2020/0278896 A1 Sep. 3, 2020

(51) Int. Cl.
*G06F 11/07* (2006.01)
*G11C 29/42* (2006.01)
*G06F 11/10* (2006.01)

(52) U.S. Cl.
CPC ........ *G06F 11/076* (2013.01); *G06F 11/1048* (2013.01); *G11C 29/42* (2013.01)

(58) Field of Classification Search
None
See application file for complete search history.

(56) References Cited

U.S. PATENT DOCUMENTS

| | | | | |
|---|---|---|---|---|
| 8,145,981 B2* | 3/2012 | Mokhlesi | ............ | G06F 11/1068 714/773 |
| 8,867,271 B2* | 10/2014 | Li | ............ | G11C 16/0483 365/185.09 |
| 9,761,308 B1* | 9/2017 | Cometti | ............ | G11C 29/52 |
| 2004/0199834 A1* | 10/2004 | Fukae | ............ | H04L 1/0002 714/699 |
| 2010/0332894 A1* | 12/2010 | Bowers | ............ | G11C 16/349 714/6.13 |
| 2016/0019948 A1* | 1/2016 | Pang | ............ | G11C 16/3459 365/185.03 |
| 2016/0232985 A1* | 8/2016 | Sabde | ............ | G01R 31/66 |
| 2017/0123902 A1* | 5/2017 | Ravimohan | ............ | H03M 13/1102 |

* cited by examiner

*Primary Examiner* — April Y Blair
*Assistant Examiner* — Matthew W Wahlin
(74) *Attorney, Agent, or Firm* — Dickinson Wright PLLC

(57) ABSTRACT

A method for error correction in a memory system includes determining a bit error ratio for a memory block of the memory system during a read operation. The method further includes determining whether the bit error ratio is between a first threshold and a second threshold. The method further includes based on a determination that the bit error ratio is between the first threshold and the second threshold, performing a select gate drain (SGD) read operation on a SGD word line of the memory block. The method further includes generating first soft bit data using SGD data corresponding to the SGD read operation. The method further includes performing a low-density parity-check correction using the first soft bit data on the memory block.

18 Claims, 6 Drawing Sheets

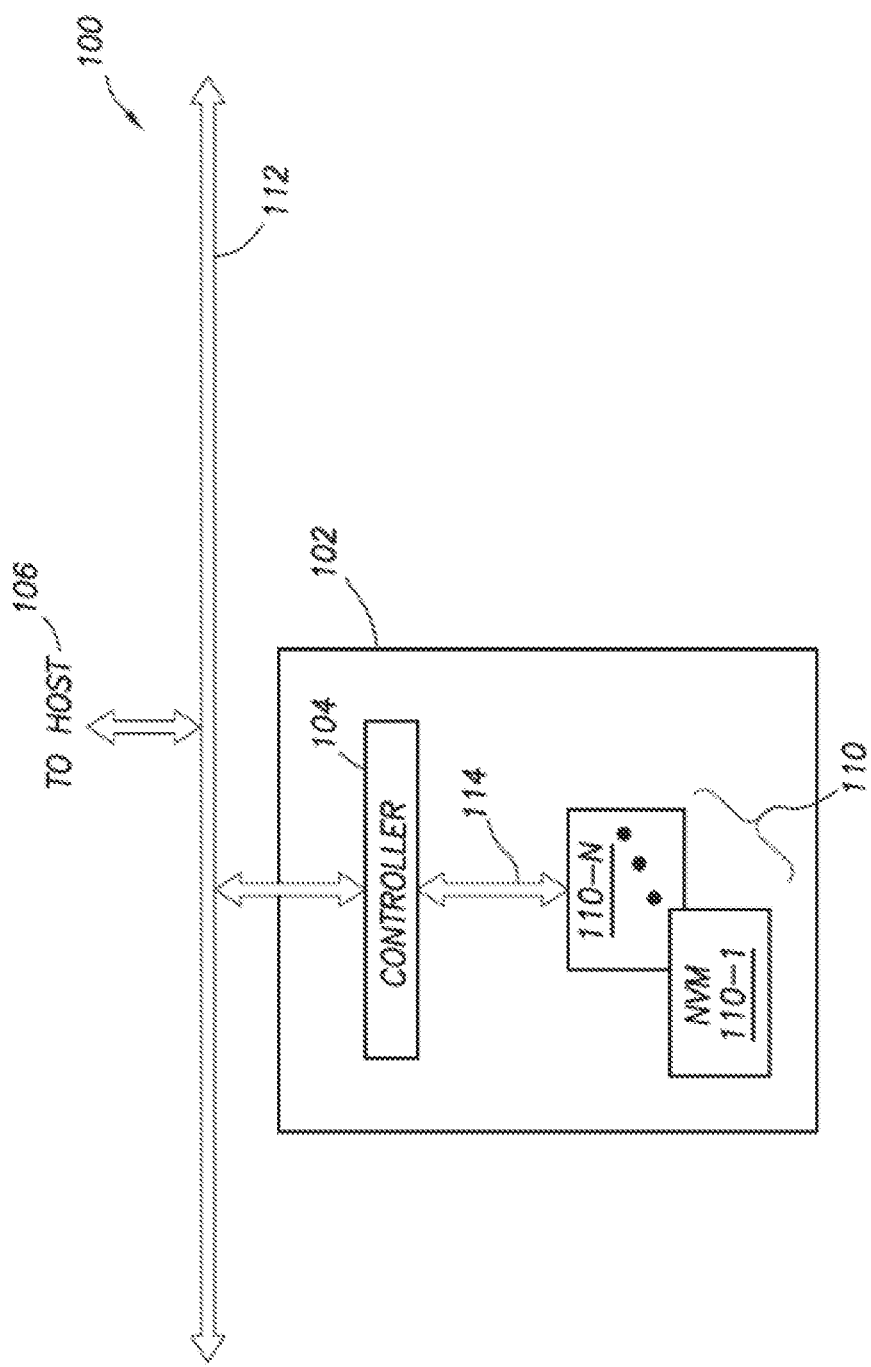

FAILURE MODE STUDY BASED ERROR CORRECTION

TECHNICAL FIELD

This disclosure relates to memory systems, and in particular to methods and systems of failure mode study based error correction.

BACKGROUND

Non-volatile memory systems provide a type of computer memory that retains stored information without requiring an external power source. One type of non-volatile memory, flash memory, is widely used in various computing devices and in stand-alone memory devices. For example, flash memory can be found in laptops, digital audio player, digital cameras, smart phones, video games, scientific instruments, industrial robots, medical electronics, solid state drives, USB drives, memory cards, and the like. Flash memory, as well as other types of non-volatile memory, can be electronically programmed/reprogrammed and erased.

Typically, a memory system includes an error correcting code (ECC) engine. The ECC engine encodes data received from a host in communication with the memory system and stores the encoded data in a memory block of the memory system. When the data is read out from the memory block, the ECC engine decodes the data and corrects errors detected within the data. To detect errors, the ECC engine implements various types of error checking using algorithms such as low-density parity-check (LDPC) code, a hard read, a soft read, and/or other suitable algorithms.

SUMMARY

This disclosure relates generally to memory management systems and methods.

An aspect of the disclosed embodiments is a method for error correction in a memory system. The method includes determining a bit error ratio for a memory block of the memory system during a read operation. The method further includes determining whether the bit error ratio is between a first threshold and a second threshold. The method further includes based on a determination that the bit error ratio is between the first threshold and the second threshold, performing a select gate drain (SGD) read operation on a SGD word line of the memory block. The method further includes generating first soft bit data using SGD data corresponding to the SGD read operation. The method further includes performing a low-density parity-check correction using the first soft bit data on the memory block.

Another aspect of the disclosed embodiments is a memory system includes a non-volatile storage having an array of memory blocks storing data and a controller in communication with the memory blocks, the controller configured to: determine a bit error ratio for a memory block of the array of memory blocks during a read operation; determine whether the bit error ratio is between a first threshold and a second threshold; based on a determination that the bit error ratio is between the first threshold and the second threshold, perform a select gate drain (SGD) read operation on a SGD word line of the memory block; generate first soft bit data using SGD data corresponding to the SGD read operation; and perform a low-density parity-check correction using the first soft bit data on the memory block.

Another aspect of the disclosed embodiments is a method for operating a memory system having a controller and blocks of memory. The method includes determining a bit error ratio for a memory block of the memory system during a read operation. The method further includes determining whether the bit error ratio is between a first threshold and a second threshold. The method further includes, based on a determination that the bit error ratio is between the first threshold and the second threshold performing a low-density parity-check correction on the memory block using first soft bit data. The method further includes, based on a determination that the bit error ratio is between the second threshold and a third threshold performing a low-density parity-check correction on the memory block using second soft bit data. The method further includes, based on a determination that the bit error ratio is above the third threshold performing a low-density parity-check correction on the memory block using third soft bit data.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 1A-1B generally illustrates a block diagram of an example non-volatile memory system according to the principles of the present disclosure.

DEFINITIONS

Figure 1B:
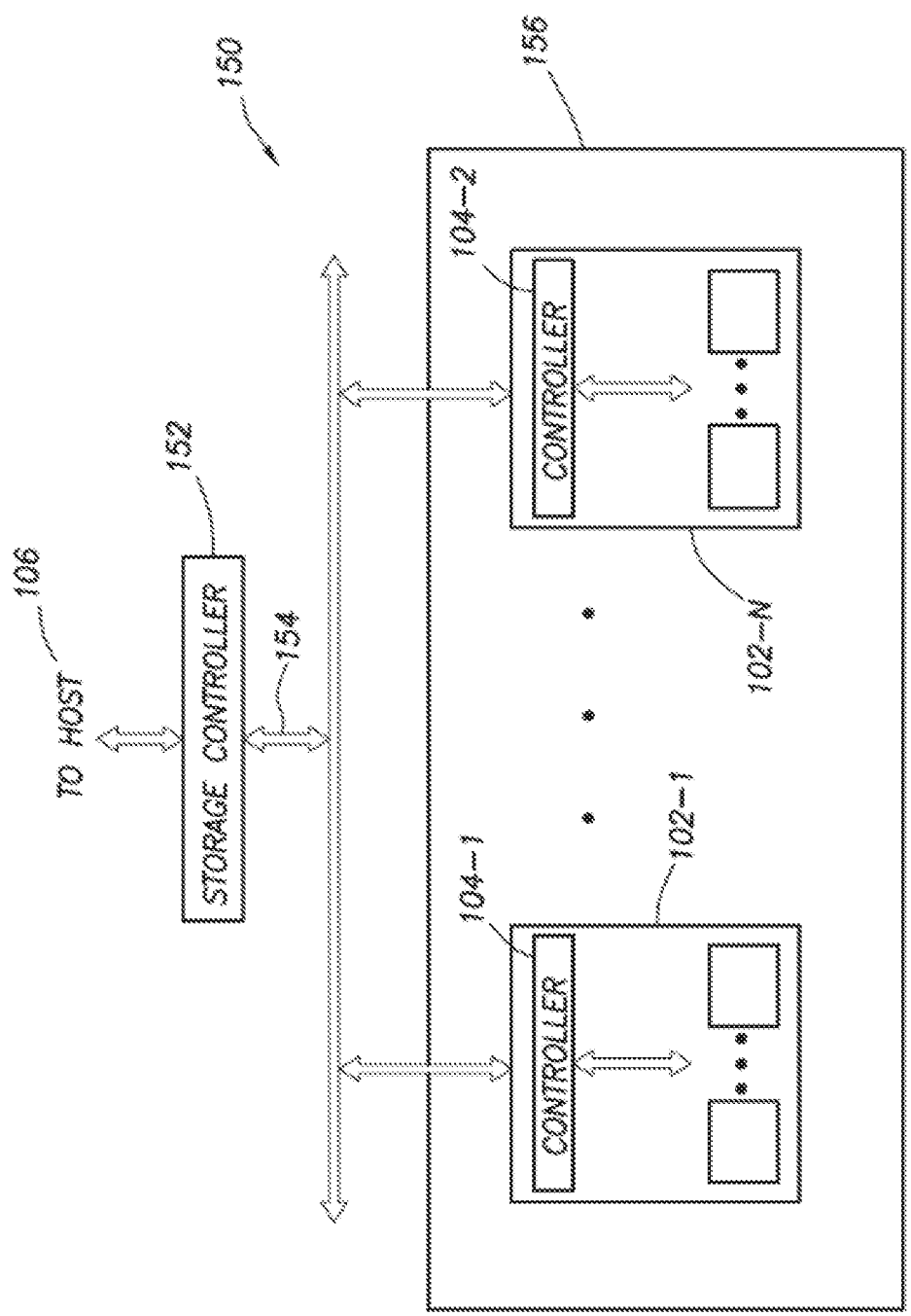

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems provide a type of computer memory that retains stored information without requiring an external power source. One type of non-volatile memory, flash memory, is widely used in various computing devices and in stand-alone memory devices. For example, flash memory can be found in laptops, digital audio player, digital cameras, smart phones, video games, scientific instruments, industrial robots, medical electronics, solid state drives, USB drives, memory cards, and the like. Flash memory, as well as other types of non-volatile memory, can be electronically programmed/reprogrammed and erased.

Typically, a memory system includes an error correcting code (ECC) engine. The ECC engine encodes data received from a host in communication with the memory system and stores the encoded data in a memory block of the memory system. When the data is read out from the memory block, the ECC engine decodes the data and corrects errors detected within the data. To detect errors, the ECC engine implements various types of error checking using algorithms such as low-density parity-check (LDPC) code, a hard read, a soft read, and/or other suitable algorithms.

In bit cost scalable (BiCS) NAND memory systems, each memory block includes a select gate drain (SGD), select gate source (SGS) and dummy word lines which are pre-programmed to a specific state, such that, respective memory blocks may be turned on/off by applying gate voltages greater than or less than a threshold voltage (Vt). For example, a voltage that is less than Vt (e.g., an inhibit voltage) may be applied to inhibit (e.g., turn off) respective bits (e.g., cells) of the memory block. Additionally, or alternatively, a voltage that is greater than Vt (e.g., a program or select voltage) may be applied to select (e.g., turn on) respective bits (e.g., cells) of the memory block. Applying gate voltages greater than or less than Vt allows a controller of the memory system to select or inhibit particular bit lines, such that, different NAND operations (e.g., program/write, erase, and read) can be performed on the particular bit lines.

As the NAND memory technologies continue to scale down, the reliability of NAND memory degrades overtime. For example, in BiCS4 NAND memory systems, the select gate and/or dummy word line Vt shifts down and/or up with cycling, which may cause transistors of the memory system to be on or off irrespective of bit programming.

In a case of a downshift of Vt, cells may conduct (e.g., appear to be selected) even if an inhibit voltage is applied (e.g., because Vt has downshifted and the inhibit voltage applied is greater than the downshifted Vt, causing the bits to be selected). This may cause bit flip during a write operation (e.g., bits that are intended to be inhibited appear selected). During a read operation of a word line of the memory block having downshifted Vt, errors may be detected. If the number of errors is significant and within the correction limit of the ECC engine will perform a correction operation to correct the errors. This can cause degradation of read performances of the memory block due to an increase in decode time. Additionally, or alternatively, if the errors in the data read at the word line is uncorrectable, the data may be lost.

Similarly, in a case of an upshift of Vt, cells may stop conducting even after a high Vt (e.g., because the applied program voltage is less than the upshifted Vt, causing the bits to be inhibited). This may result in erase failures and bit flips during a write operation of the memory block, which in turn may cause read operation failures. Additionally, or alternatively, there may be weak word line-word line (e.g., word line-word line shorts) in word lines of the memory block, which may ultimately corrupt data stored in the memory block. The impact of voltage downshift, voltage upshift, or week word line-word line, is increased during cases of cross temperature and at high program-erase cycles, which may lead to delays between memory operations and to an increase in a defective parts per million (DPPM) in BiCS memory systems.

In order to prevent voltage downshift and/or voltage upshift, typical memory systems periodically monitor the select gate Vt and then the select gate Vt is soft programmed to normal position once the Vt is detected to be lower than an acceptable range. After meeting a certain hot count value, a select gate detection and correction feature is enabled for a particular meta-block of the memory system. Hereafter, Every meta-block having erase operations performed on it will go through detection (e.g., checking 0's count for voltage downshift and 1's count for voltage upshift) for the select gate Vt for, for example, all planes of the memory block in all strings of the memory block.

Additionally, or alternatively, if bit error count exceeds a particular limit for any plane of the memory block, a select gate program operation for all strings in the memory block is triggered on the failing plane to bring the Vt back in acceptable range as part of SGD/SGS correction.

In order to correct the corrupted data caused as a result of weak word line-word line shorts, typical memory systems perform an XOR operation of odd-odd and even-even word lines and store data resulting from the XOR operation in random access memory (RAM). If a read operation results in a failure, the RAM is referred to and the data stored in the RAM is used for data recovery.

However, with such typical memory systems, voltage downshift and/or upshift correction is done after a gap of certain cycles. During intermediate cycles, if the bit errors occur due to voltage downshift, decoding times increase (e.g., if the bit error count is in a correctable range) leading to a degradation in read operation performance or the data may be lost (e.g., if the bit error count is outside of the correctable range, which results in uncorrectable data).

Additionally, or alternatively, bit errors that occur due to voltage upshift may increase a likelihood that erase operation failures may occur for the memory block. If erase operation failures occur, the memory block may be retired. Retiring multiple memory blocks may cause a memory card associated with the retired memory blocks to enter a read-only mode.

Further, such typical memory systems require performing XOR computations, as described, to address weak word line-word line shorts. Such typical memory systems require XOR components to compute the XOR operation and additional RAM to store the data resulting from the XOR operation, which increases the product cost of the memory system.

In addition to the above, typical memory systems perform LDPC correction operations using hard bit data to correct errors if a bit error ratio, as will be described, of detected errors is above a first threshold and below a second threshold. For example, the first threshold may include 80 bit errors per 4 kilobytes (KB) read and the second threshold may include 250 bit errors per 4 KB read, however, the first threshold and the second threshold may include any suitable number of bit errors detected per any suitable amount of memory read. LDPC correction operations using hard bit data can be resource intensive and can negatively impact performance of the memory system. Further, the time it takes to perform LDPC correction operations using hard bit data drastically increases as the bit error ratio increases, which may lead to uncorrectable data when bit error ratios are above a third threshold (e.g., 530 bit errors detected by 4 KB read, or other suitable threshold above the second threshold).

Accordingly, improved systems and methods, such as those described herein, that perform voltage downshift correction voltage upshift correct, and/or weak word line-word line short correction may be desirable. In some embodiments, such systems and methods are configured to detect failures (e.g., failure modes) in data resulting from operations performed on the memory block and to identify bit data corresponding with bits associated with the failures. In some embodiments, the systems and methods disclosed herein use the bit data to perform error correction operations on the memory block. Additionally, or alternatively, the bit data corresponding to bits having failures resulting from voltage downshift, voltage upshift, dummy word lines shift, and weak word line-word line shorts is used to generate soft bit data. The ECC engine may perform an LDPC correction operation using the soft bit data, which may enable the bits to be corrected faster relative to memory systems that does not use such soft bit data (e. g., because these type of errors or failures may result in hard bit errors in typical memory systems and may take longer to correct). Soft bit data is used by the ECC engine to perform the LDPC correction operation to indicate the probability of a bit flip. Performing an LDPC correction operation using soft bit data takes less time to decode (e.g., than using hard bit data) and also may result in better error correction results.

In some embodiments, to detect voltage downshift, the systems and methods disclosed herein may generate data using a select gate detection sequence which may perform read operations at a lower voltage (e.g., relative to typical read operations) to detect a lower tail associated with the downshifted voltages. Bits having voltage downshift are read as 1's. The data resulting from the lower voltage read operations may be complimented, which may flip the 1's of the data to 0's and vice-versa. As described, the ECC engine may perform an LDPC correction operation using the generated soft bit data to correct errors associated with voltage downshift.

In some embodiments, to detect voltage upshift, the systems and methods disclosed herein may generate data using the select gate detection which may perform read operations at a higher voltage (e.g., relative to typical read operations) to detect an upper tail associated with the upshifted voltages. Bits having voltage upshift are read as 0's. As described, when the number of 0's is above a certain threshold, erase operations failures may occur because the bits which are voltage upshifted stop conducting. As such, the systems and methods disclosed herein may increase a zero bit check for erase operations to prevent and/or reduce erase operation failures. As described, the ECC engine may perform an LDPC correction operation using the generated soft bit data to correct errors associated with voltage upshift.

In some embodiments, to detect weak word line-word line shorts, the systems and methods disclosed herein may collect noise check data to identify which particular bits are short and may generate word line short data that includes 0's for bits that are short and 1's for all other bits. The word line short data may be used to generate soft bit data. As described, the ECC engine may perform an LDPC correction operation using the soft bit data to correct errors associated with word line-word line short.

The systems and methods described herein may improve maintaining sustained read operation performance at all times and at extreme temperatures, improve recovery of data that is typically determined to be uncorrectable resulting from select gate voltage downshift and upshift, increase data reliability by compacting data associated with bits having select gate downshift or upshift to a destination memory block (e.g., such as a single-level cell memory block), increase program-erase cycle performance by increasing data integrity, resulting from select gate downshift, upshift, or other errors, increases LDPC correction operation capability using the detected downshift and upshift data resulting in hard bit error correction at higher bit error ratios, reduced or postpones memory block retirement as a result of select gate upshift, prevents or postpones a flash card from entering read-only mode, and decreases the overall DPPM for the memory block.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. The host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the host 106 can access data stored in the storage system 102 by providing a logical address to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells or NOR flash memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers.

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, or 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

FIG. 1B generally illustrates a block diagram of a system architecture according 100 to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150 the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
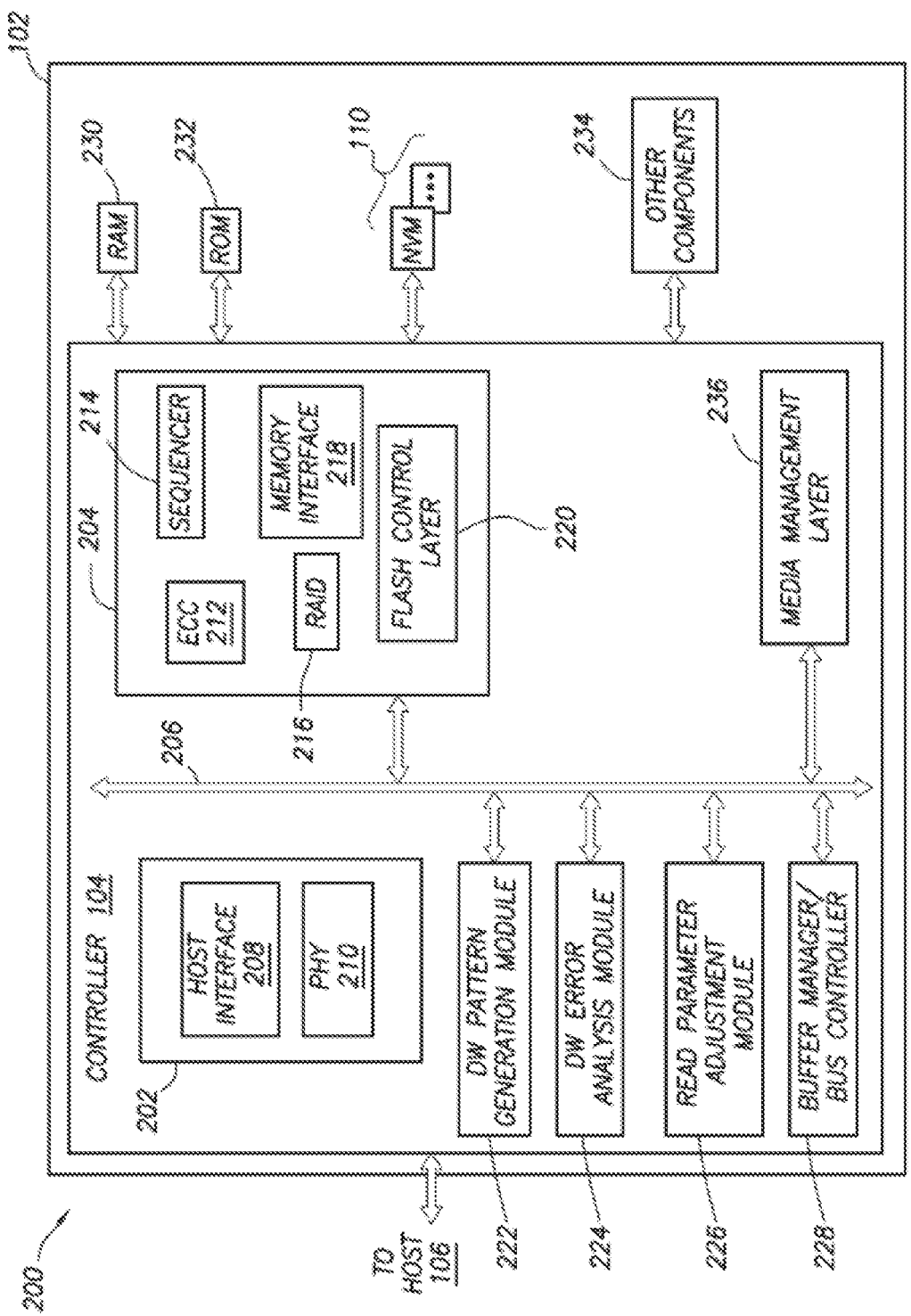
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM memory block 110. When the data is read out from the NVM memory block 110, the ECC engine 212 decodes the data and corrects errors detected within the data. To detect errors, the ECC engine 212 implements various types of error checking using algorithms such as low-density parity-check (LDPC) code, Bose-Chaudhuri-Hocquenghem (BCH) code, a hard read, a soft read, extra parity and/or other suitable algorithms.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
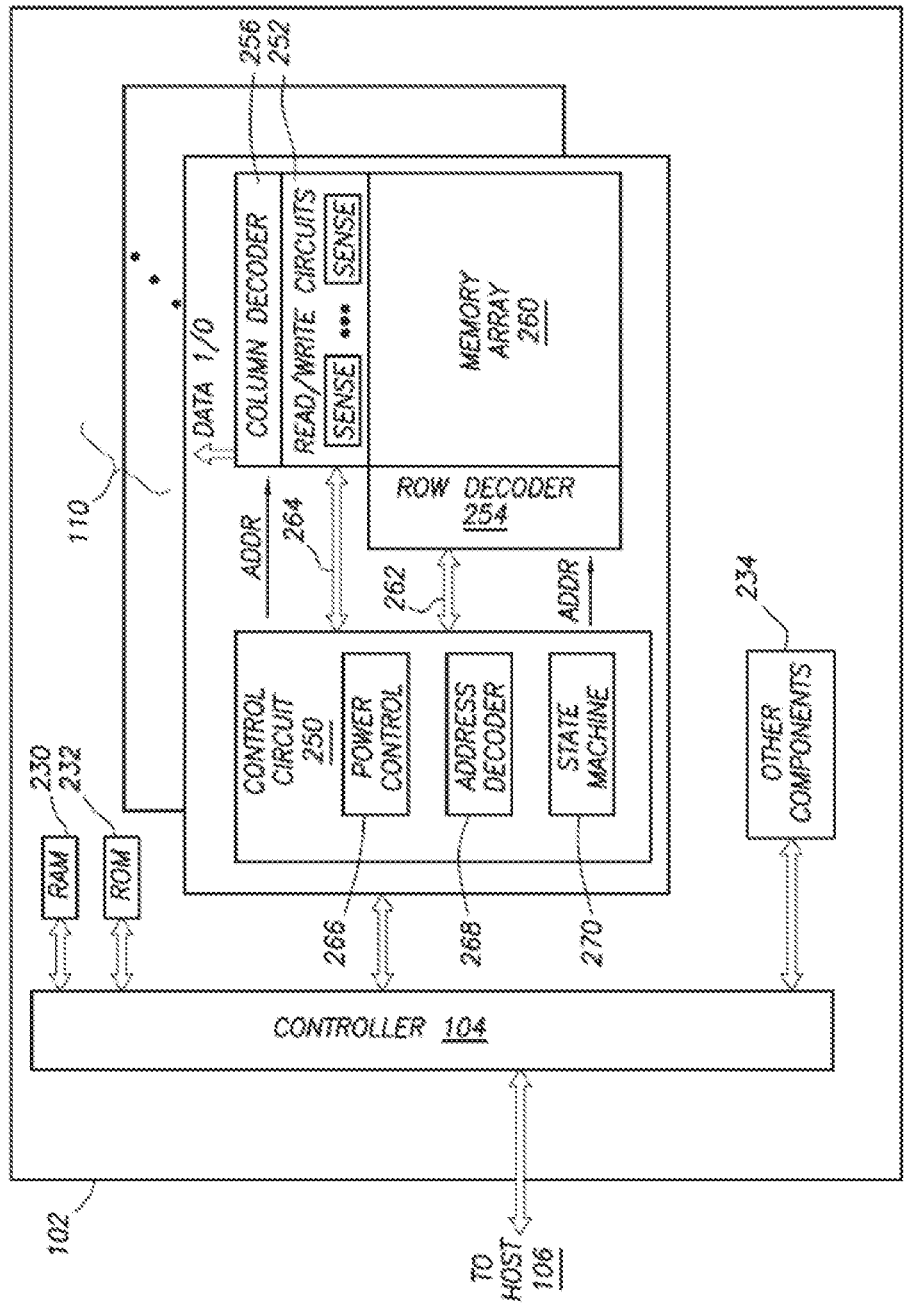
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all the memory die within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260 which reduces the densities of access lines and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits, are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260.

Figure 3:
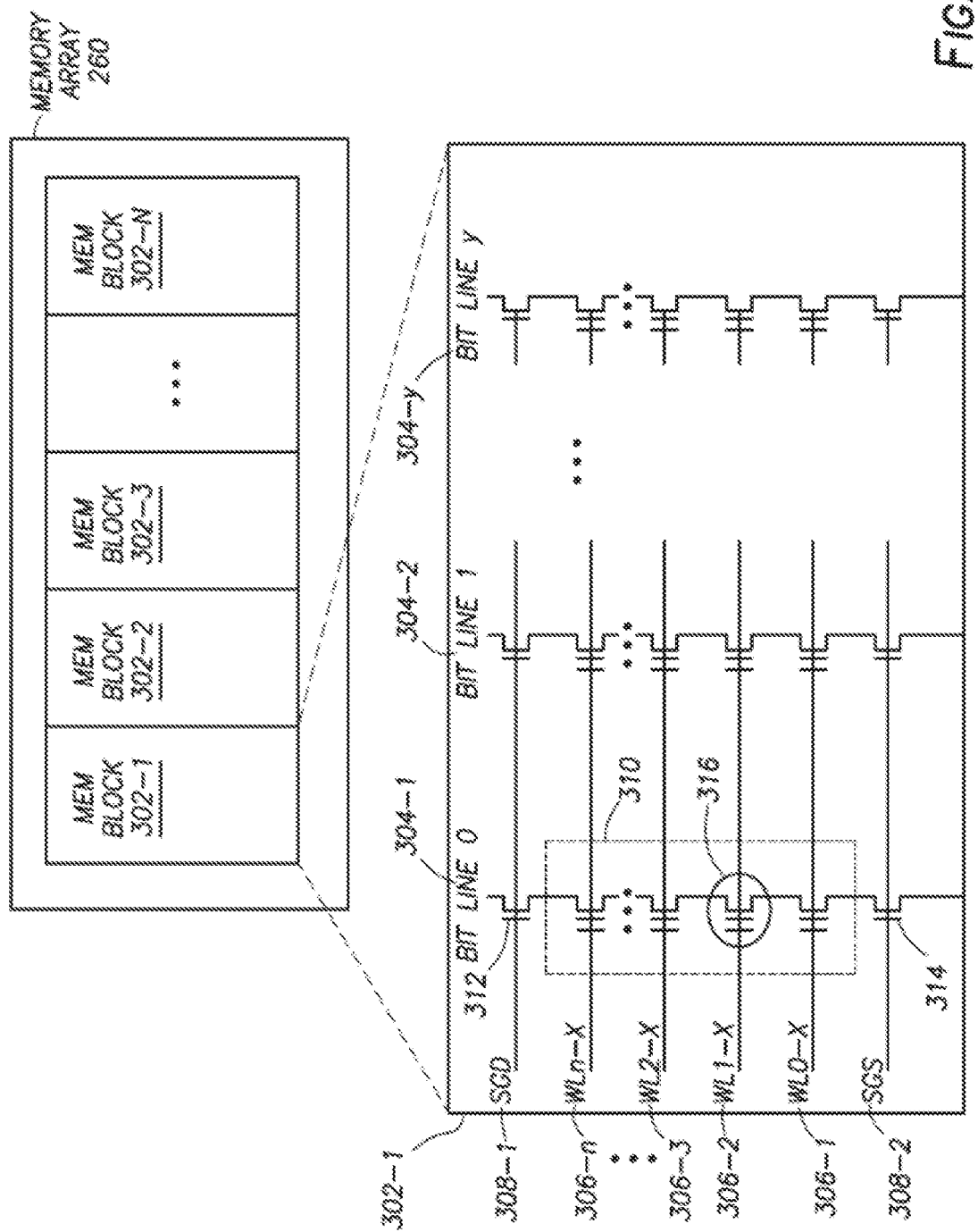
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 may perform error correction operations using soft bit data, as will be described. In some embodiments, the controller 104 may perform error correction operation using soft bit data periodically, such as, every 100 cycles (e.g., for multi-level cell memory systems, such as, triple-level cell memory systems), every 1000 cycles (e.g., for single-level cell memory systems), or other suitable period. As described, the controller 104 includes the ECC engine 212. In some embodiments, the ECC engine 212 encodes data received from the host 106 and stores the encoded data in the NVM memory block 110. When the data is read out from the NVM memory block 110, the ECC engine 212 decodes the data and corrects errors detected within the data. To detect errors, the ECC engine 212 implements various types of error checking using an LDPC correction operation, or other suitable operation. LDPC code includes linear error correcting code and may using hard-decision or soft-decision decoding.

The controller 104 may determine a bit error ratio for bit errors detected during performance of operations, for example, performance of a read operation, or a memory block, such as the memory block 302-1 (e.g., or any other memory block of the storage system 102) of the memory array 206. The bit error ratio may corresponding to a total number of bit errors detected per 4 KB read. It should be understood that while the bit error ratio is described as being the total number of bit errors detected per 4 KB, the bit error ratio can correspond to the total number of bit errors detected per any suitable memory size, for example, 2 KB, or other suitable memory size.

The detected bit errors may be the result of select gate voltage downshift, select gate voltage upshift, weak word line-word line shorts, and the like. As described, typical memory systems perform LDPC correction operations using hard bit data to correct errors associated with a bit error ratio when the bit error ratio is between a first threshold and a second threshold. For example, the first threshold may include 80 bit errors per 4 KB read and the second threshold may include 250 bit errors per 4 KB bits read, however, the first threshold and the second threshold may include any suitable threshold.

LDPC correction operations using hard bit data can be resource intensive and can negatively impact performance of the memory system. Further, the time it takes to perform LDPC correction operations using hard bit data drastically increases as the bit error ratio increases, which may lead to uncorrectable data when bit error ratios are above a third threshold (e.g., 530 bit errors detected per 4 KB read, or other suitable threshold above the second threshold).

Accordingly, the controller 104 is configured to perform LDPC correction operations using first soft bit data, as will be described, for bit error ratios between the first threshold and the second threshold, second soft bit data, as will be described, for bit error ratios between the second threshold and the third threshold, and third soft bit data, as will be described, for bit error ratios above the third threshold.

In some embodiments, the controller 104 determines whether the bit error ratio (e.g., associated with operations performed on the memory block 302-1) is above the first threshold. If the controller 104 determines that the bit error ratio is below the first threshold, the controller 104 may perform a standard read operation and perform standard error correction, accordingly. For example, the controller 104 selectively instruct the ECC engine 212 to perform an LDPC correction operation using word line soft bit data on the memory block 302-1, in order to correct bit errors associated with the bit error ratio that is below the first threshold. If the controller 104 determines that the bit error ratio is above the first threshold, the controller 104 determines whether the bit error ratio is between the between the first threshold and the second threshold. If the controller 104 determines that the bit error ratio is between the first threshold and the second threshold, the controller 104 may perform an SGD (e.g., select gate drain, as described) read operation on a SGD word line of the memory block 302-1. The SGD word line is common to all word lines in the memory block 302-1, and may provide data indicating select gate voltage downshift and/or upshift for the associated word lines of the memory block 302-1. The SGD read operation on the SGD word line of the memory block 302-1 returns SGD data that corresponds to the bit values of the SGD word line. The bit values may indicate SGD word line bits having downshifted or upshifted Vt (e.g., bit value of 1) and may indicate that SGD word line bits having normal Vt (e.g., bit value of 0).

The controller 104 may generate first soft bit data using the SGD data corresponding to the SGD read operation of the SGD word line. The controller 104 may perform a logical NOT using the SGD data and a string of is in order to compliment the data (e.g., flip bit values of the SGD data from 1s to 0s and 0s to 1s). In some embodiments, the controller 104 stores the first soft bit data in RAM of the storage system 102, or other suitable location.

The controller 104 may selectively instruct the ECC engine 212 to perform an LDPC correction operation using the first soft bit data for subsequent reads of the memory block 302-1, in order to correct bit errors associated with the bit error ratio that is between the first threshold and the second threshold and/or to preemptively repair Vt downshift and/or upshift before the Vt downshift and/or upshift is detected (e.g., either because the respective bits have not been read or because the Vt shift is not great enough to be detected).

If the controller 104 determines that the bit error ratio is above the second threshold, the controller 104 determines whether the bit error ratio is below the third threshold (e.g., between the second threshold and the third threshold). If the controller 104 determines that the bit error ratio is between the second threshold and the third threshold, the controller 104 may perform an SGD read operation on the SGD word line of the memory block 302-1. The SGD read operation on the SGD word line of the memory block 302-1 returns the SGD data. The controller 104 may generate the first soft bit data, as described, using the SGD data corresponding to the SGD read operation of the SGD word line. In some embodiments, the first soft bit data may be previously stored in RAM of the storage system 102. Accordingly, the controller 104 may retrieve the first soft bit data and may omit performing an SGD read operation on the SGD word line of the memory block 302-1 and generating the first soft bit data for bit error ratios that are between the second threshold and the third threshold.

The controller 104 generates second soft bit data using the first soft bit data and word line soft bit data of the memory block 302-1. The word line soft bit data may correspond to soft bit data derived from word line data resulting from word line read operations performed on one or more of the word lines, such as the word lines 306 (e.g., other than the SGD word line), of the memory block 302-1 or other memory blocks 302-2 to 302-N of the memory array 260. In some embodiments, the controller 104 generates the second soft bit data by performing a logical AND on the first soft bit data and the word line soft bit data. The controller 104 may selectively instruct the ECC engine 212 to perform an LDPC correction operation using the second soft bit data on the memory block 302-1, in order to correct bit errors associated with the bit error ratio that is between the second threshold and the third threshold.

If the controller 104 determines that the bit error ratio is above the third threshold, the controller 104 may perform an SGD read operation on the SGD word line of the memory block 302-1. The SGD read operation on the SGD word line of the memory block 302-1 returns the SGD data. The controller 104 may generate the first soft bit data, as described, using the SGD data corresponding to the SGD read operation of the SGD word line. In some embodiments, the first soft bit data may be previously stored in RAM of the storage system 102. Accordingly, the controller 104 may retrieve the first soft bit data and may omit performing an SGD read operation on the SGD word line of the memory block 302-1 and generating the first soft bit data for bit error ratios that are above the third threshold.

The controller 104 generates third soft bit data using the first soft bit data, first word line soft bit data, and second word line soft bit data of the memory block 302-1. The first word line soft bit data may correspond to soft bit data derived from word line data resulting from a first word line read operation performed on one or more of the word lines, such as the word lines 306 (e.g., other than the SGD word line), of the memory block 302-1 or other memory blocks 302-2 to 302-N of the memory array 260. The second word line soft bit data may correspond to soft bit data derived from word line data resulting from a second word line read operation performed on one or more word lines, such as the word likes 306 (e.g., other than the SGD word line and the one or more word lines used to generated the first word line data), of the memory block 302-1 or other memory blocks 302-2 to 302-N of the memory array 260. The controller 104 performs a logical AND on the first soft bit data and the first word line soft bit data. In some embodiments, the controller 104 stores a previously determined second soft bit data, which may correspond to a logical AND of the first soft bit data and the first word line soft bit data (e.g., the controller 104 may retrieve the second soft bit data and omit performing a logical AND on the first soft bit data and the first word line data for bit error ratios above the third threshold). The controller 104 generates the third soft bit data by performing a logical AND on the second word line soft bit data and the result of the logical AND of the first soft bit data and the first word line soft bit data (e.g., or the second soft bit data). The controller 104 may selectively instruct the ECC engine 212 to perform an LDPC correction operation using the third soft bit data on the memory block 302-1, in order to correct bit errors associated with the bit error ratio that is above the third threshold.

In some embodiments, to detect voltage downshift, the controller 104 may perform read operations on the memory block 302-1 at a lower voltage (e.g., relative to typical read operations) to detect a lower tail associated with the downshifted voltages. Bits having voltage downshift are read as 1's. The data resulting from the lower voltage read operations may be complimented using a NOT operation, which may flip the 1's of the data to 0's and vice-versa, as described. The controller 104 may selectively instruct the ECC engine 212 to perform an LDPC correction operation using the first soft bit data, as described, to correct detected bit errors associated with voltage downshift.

In some embodiments, to detect voltage upshift, the controller 104 may perform read operations at a higher voltage (e.g., relative to typical read operations) to detect an upper tail associated with the upshifted voltages. Bits having voltage upshift are read as 0's. As described, when the number of 0's is above a certain threshold, erase operations performed on the memory block 302-1 may result in bit errors because the bits which are voltage upshifted stop conducting. The controller 104 may increase a zero bit check for erase operations performed on the memory block 302-1 to prevent and/or reduce erase operation failures when performing erase operations on the memory block 302-1.

The controller 104 may selectively instruct the ECC engine 212 to perform an LDPC correction operation using the first soft bit data, as described, to correct detected bit errors associated with voltage upshift.

In some embodiments, to detect weak word line-word line shorts, the controller 104 may collect noise check data to identify which particular bits are short. The controller 104 may generate word line short data that includes 0's for bits that are short and 1's for all other bits. The word line short data may be used to generate fourth soft bit data. The controller 104 may selectively instruct the ECC engine 212 to perform an LDPC correction operation using the fourth soft bit data, as described, to correct detected bit errors associated with word line-word line short.

Figure 4:
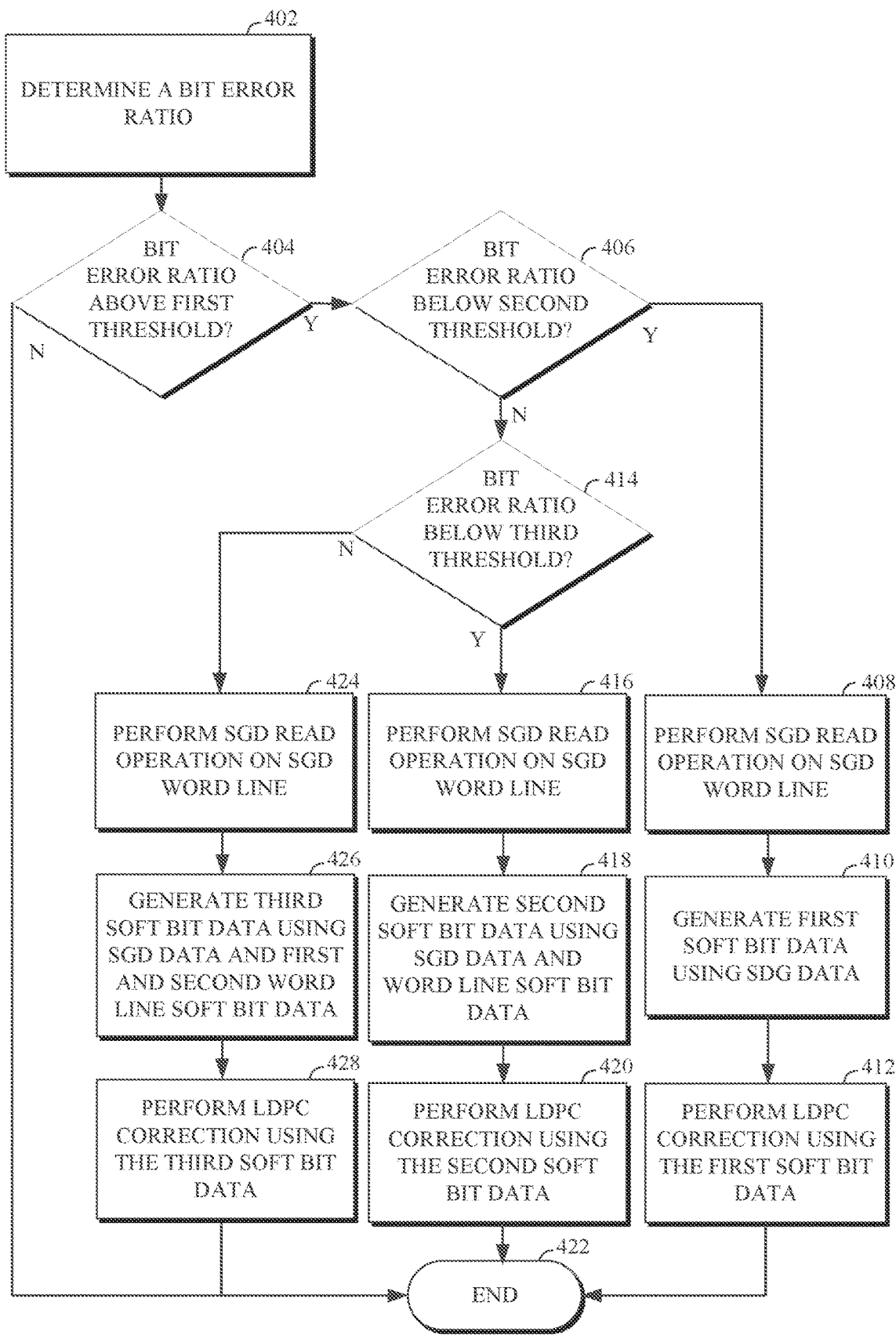
FIG. 4 is a flow diagram illustrating an error correction method according to the principles of the present disclosure.

FIG. 4 generally illustrates flow diagram illustrating a reverse mapping and data consolidation method 400 according to the principles of the present disclosure. In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

At 402, the method 400 determines a bit error ratio. As described, the controller 104 determines a bit error ratio based on bit errors detected during performance of operations, such as read operations, on the memory block 302-1.

At 404, the method 400 determines whether the bit error ratio is above the first threshold. As described, the controller 104 determines whether the bit error ratio is above the first threshold. If the method 400 determines that the bit error ratio is below the first threshold, the method ends at 422. If the method 400 (e.g., using the controller 104) determines the bit error ratio is above the first threshold, the method 400 continues at 406. At 406, the method 400 determines whether the bit error ratio is below the second threshold. As described, the controller 104 determines whether the bit error ratio is below the second threshold (e.g., between the first threshold and the second threshold). If the method 400 (e.g., using the controller 104) determines that the bit error ratio is below the second threshold (e.g., between the first threshold and the second threshold), the method 400 continues at 408. If the method 400 (e.g., using the controller 104) determines that bit error ratio is above the second threshold, the method 400 continues at 414.

At 408, the method 400 performs an SGD read operation on the SGD word line. As described, the controller 104 may perform the SGD read operation on the SGD word line. The SGD read of the SGD word line may result in SGD data, as described.

At 410, the method 400 generate first soft bit data using SGD data. As described, the controller 104 may generate the first soft bit data by performing a logical NOT on the SGD data and a string of 1s.

At 412, the method 400 performs an LDPC correction operation using the first soft bit data. As described, the controller 104 may selectively instruct the ECC engine 212 to perform an LDPC correction operation using the first soft bit data, as described, on word lines of the memory block 302-1, in order to correct bit errors associated with the bit error ratio that is between the first threshold and the second threshold and/or to preemptively repair Vt downshift and/or upshift before the Vt downshift and/or upshift is detected (e.g., either because the respective bits have not been read or because the Vt shift is not great enough to be detected). The method 400 ends at 422.

At 414, the method 400 determines whether the bit error ratio is below the third threshold. As described, the controller 104 determines whether the bit error ratio is below the third threshold (e.g., between the second threshold and the third threshold). If the method 400 (e.g., using the controller 104) determines that the bit error ratio is below the third threshold (e.g. between the second threshold and the third threshold), the method 400 continues at 416. If the method 400 (e.g., using the controller 104) determines that the bit error ratio is above the third threshold, the method continues at 424.

At 416, the method 400 performs an SGD read operation on the SGD word line. As described, the controller 104 may perform the SGD read operation on the SGD word line. The SGD read of the SGD word line may result in SGD data, as described.

At 418, the method 400 generates second soft bit data using the SGD data and word line soft bit data. As described, the controller 104 may generate the second soft bit data. In some embodiments, the controller 104 generates the first soft bit data using the SGD data, as described. The controller 104 performs a logical AND on the first soft bit data and the word line soft bit data, as described. In some embodiments, the controller 104 retrieves the previously stored first soft bit data, as described, and generates the second soft bit data using the retrieved first soft bit data and the word line soft bit data.

At 420, the method 400 performs an LDPC correction operation using the second soft bit data. As described, the controller 104 may selectively instruct the ECC engine 212 to perform an LDPC correction operation using the second soft bit data on the memory block 302-1, in order to correct bit errors associated with the bit error ratio that is between the second threshold and the third threshold. The method 400 ends at 422.

At 424, the method 400 performs an SGD read operation on the SGD word line. As described, the controller 104 may perform the SGD read operation on the SGD word line. The SGD read of the SGD word line may result in SGD data, as described.

At 426, the method 400 generates third soft bit data using the SGD data, first word line soft bit data, and second word line soft bit data. As described, the controller 104 may generate the third soft bit data. In some embodiments, the controller 104 generates the first soft bit data using the SGD data, as described. In some embodiments, the controller 104 retrieves the previously stored first soft bit data, as described. The controller 104 performs a logical AND on the first soft bit data and the first word line soft bit data, as described. The controller 104 generates the third soft bit data by performing a logical AND of the second word line soft bit data and the result of the logical AND of the first soft bit data and the first word line soft bit data.

At 420, the method 400 performs an LDPC correction operation using the third soft bit data. As described, the controller 104 may selectively instruct the ECC engine 212 to perform an LDPC correction operation using the third soft bit data on the memory block 302-1, in order to correct bit errors associated with the bit error ratio that is above the third threshold. The method 400 ends at 422

In some embodiments, a method for error correction in a memory system includes determining a bit error ratio for a memory block of the memory system during a read operation. The method further includes determining whether the bit error ratio is between a first threshold and a second threshold. The method further includes based on a determination that the bit error ratio is between the first threshold and the second threshold, performing a select gate drain (SGD) read operation on a SGD word line of the memory block. The method further includes generating first soft bit data using SGD data corresponding to the SGD read operation. The method further includes performing a low-density parity-check correction using the first soft bit data on the memory block.

In some embodiments, the first threshold includes 80 bit errors per 4 KB read and the second threshold includes 250 bit errors per 4 KB read. In some embodiments, the first soft bit data includes a logical NOT of the SGD data. In some embodiments, the SGD word line is common to all word lines in the memory block. In some embodiments, the bit error ratio is between the second threshold and a third threshold. In some embodiments, the method further includes generating second soft bit data using the first soft bit data and word line soft bit data of the memory block. In some embodiments, the method further includes performing a low-density parity-check correction using the second soft bit data on the memory block. In some embodiments, the method further includes based on a determination that the bit error ratio is above a third threshold that is greater than the second threshold, performing a low-density parity-check correction on the memory block using third soft bit data.

In some embodiments, a memory system includes a non-volatile storage having an array of memory blocks storing data and a controller in communication with the memory blocks, the controller configured to: determine a bit error ratio for a memory block of the array of memory blocks during a read operation; determine whether the bit error ratio is between a first threshold and a second threshold; based on a determination that the bit error ratio is between the first threshold and the second threshold, perform a select gate drain (SGD) read operation on a SGD word line of the memory block; generate first soft bit data using SGD data corresponding to the SGD read operation; and perform a low-density parity-check correction using the first soft bit data on the memory block.

In some embodiments, the first threshold includes 80 bit errors per 4 KB read and the second threshold includes 250 bit errors per 4 KB read. In some embodiments, the first soft bit data includes a logical NOT of the SGD data. In some embodiments, the SGD word line is common to all word lines in the memory block. In some embodiments, the bit error ratio is between the second threshold and a third threshold. In some embodiments, the controller is further configured to generate second soft bit data using the first soft bit data and word line soft bit data of the memory block. In some embodiments, the controller is further configured to perform a low-density parity-check correction using the second soft bit data on the memory block. In some embodiments, the controller is further configured to, based on a determination that the bit error ratio is above a third threshold that is greater than the second threshold, perform a low-density parity-check correction on the memory block using third soft bit data.

In some embodiments, a method for operating a memory system having a controller and blocks of memory includes determining a bit error ratio for a memory block of the memory system during a read operation. The method further includes determining whether the bit error ratio is between a first threshold and a second threshold. The method further includes, based on a determination that the bit error ratio is between the first threshold and the second threshold, performing a low-density parity-check correction on the memory block using first soft bit data. The method further includes, based on a determination that the bit error ratio is between the second threshold and a third threshold, performing a low-density parity-check correction on the memory block using second soft bit data. The method further includes, based on a determination that the bit error ratio is above the third threshold, performing a low-density parity-check correction on the memory block using third soft bit data.

In some embodiments, the first threshold includes 80 bit errors per 4 KB read, the second threshold includes 250 bit errors per 4 KB read, and the third threshold includes 530 bit errors per 4 KB read. In some embodiments, the first soft bit data includes a logical NOT of select gate drain (SGD) data corresponding to an SGD word line of the memory block. In some embodiments, the second soft bit data includes a logical AND of the first soft bit data and the word line soft bit data. In some embodiments, the method further includes, based on a determination that the bit error ratio corresponds to bit errors caused by weak word line-word line shorts, generating word line short data. In some embodiments, the method further includes generating fourth soft bit data using the word line short data and performing a low-density parity-check on the memory block using the fourth soft bit data The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for error correction in a memory system, the method comprising:

determining a bit error ratio for a memory block of the memory system during a read operation;

determining whether the bit error ratio is between a first threshold and a second threshold;

based on a determination that the bit error ratio is between the first threshold and the second threshold, performing a select gate drain (SGD) read operation on a SGD word line of the memory block;

generating first soft bit data using SGD data corresponding to the SGD read operation;

performing a low-density parity-check correction using the first soft bit data on the memory block; and based on a determination that the bit error ratio is above a third threshold that is greater than the second threshold, performing a low-density parity-check correction on the memory block using third soft bit data, different from the first soft bit data.

2. The method of claim 1, wherein the first threshold includes 80 bit errors per 4 KB bits read and the second threshold includes 250 bit errors per 4 KB read.

3. The method of claim 1, wherein the first soft bit data includes a logical NOT of the SGD data.

4. The method of claim 1, wherein the SGD word line is common to all word lines in the memory block.

5. The method of claim 1, wherein the bit error ratio is between the second threshold and a third threshold.

6. The method of claim 5, further comprising, generating second soft bit data using the first soft bit data and word line soft bit data of the memory block.

7. The method of claim 6, further comprising, performing a low-density parity-check correction using the second soft bit data on the memory block.

8. A memory system comprising:
a non-volatile storage having an array of memory blocks storing data; and
a controller in communication with the memory blocks, the controller configured to:
determine a bit error ratio for a memory block of the array of memory blocks during a read operation;
determine whether the bit error ratio is between a first threshold and a second threshold;
based on a determination that the bit error ratio is between the first threshold and the second threshold, perform a select gate drain (SGD) read operation on a SGD word line of the memory block;
generate first soft bit data using SGD data corresponding to the SGD read operation;
perform a low-density parity-check correction using the first soft bit data on the memory block; and
based on a determination that the bit error ratio is above a third threshold that is greater than the second threshold, perform a low-density parity-check correction on the memory block using third soft bit data, different from the first soft bit data.

9. The system of claim 8, wherein the first threshold includes 80 bit errors per 4 KB read bits and the second threshold includes 250 bit errors per 4 KB read.

10. The system of claim 8, wherein the first soft bit data includes a logical NOT of the SGD data.

11. The system of claim 8, wherein the SGD word line is common to all word lines in the memory block.

12. The system of claim 8, wherein the bit error ratio is between the second threshold and a third threshold.

13. The system of claim 12, wherein the controller is further configured to generate second soft bit data using the first soft bit data and word line soft bit data of the memory block.

14. The system of claim 13, wherein the controller is further configured to perform a low-density parity-check correction using the second soft bit data on the memory block.

15. A method for operating a memory system having a controller and blocks of memory, the method comprising:
determining a bit error ratio for a memory block of the memory system during a read operation;
determining whether the bit error ratio is between a first threshold and a second threshold;
based on a determination that the bit error ratio is between the first threshold and the second threshold, performing a low-density parity-check correction on the memory block using first soft bit data;
based on a determination that the bit error ratio is between the second threshold and a third threshold, performing a low-density parity-check correction on the memory block using second soft bit data; and
based on a determination that the bit error ratio is above the third threshold, performing a low-density parity-check correction on the memory block using third soft bit data, wherein the third soft bit data is different from the first soft bit data.

16. The method of claim 15, wherein the first threshold includes 80 bit errors per 4 KB read, the second threshold includes 250 bit errors per 4 KB read, and the third threshold includes 530 bit errors per 4 KB read.

17. The method of claim 15, further comprising, based on a determination that the bit error ratio corresponds to bit errors caused by weak word line-word line shorts, generating word line short data.

18. The method of claim 17, further comprising, generating fourth soft bit data using the word line short data and performing a low-density parity-check on the memory block using the fourth soft bit data.

* * * * *